United States Patent
Shimada et al.

(10) Patent No.: US 7,718,008 B2
(45) Date of Patent: May 18, 2010

(54) METHOD FOR CLEANING PHOTO MASK

(75) Inventors: Shu Shimada, Tokyo (JP); Noriyuki Takahashi, Tokyo (JP); Hiroko Tanaka, Tokyo (JP); Hiroyuki Ishii, Tokyo (JP); Yusuke Shoji, Tokyo (JP); Masashi Ohtsuki, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 467 days.

(21) Appl. No.: 11/839,655

(22) Filed: Aug. 16, 2007

(65) Prior Publication Data

US 2008/0251100 A1  Oct. 16, 2008

(30) Foreign Application Priority Data

Aug. 24, 2006 (JP) .............................. 2006-227252

(51) Int. Cl.
 *B08B 7/00* (2006.01)
 *G01N 21/00* (2006.01)

(52) U.S. Cl. ................. 134/1.1; 134/1; 134/2; 134/3; 250/492.2

(58) Field of Classification Search ................. None
See application file for complete search history.

(56) References Cited

U.S. PATENT DOCUMENTS 6,828,569 B2 * 12/2004 Van Schaik et al. ...... 250/492.2

2001/0026355 A1 * 10/2001 Aoki et al. .................... 355/30

FOREIGN PATENT DOCUMENTS

| JP | 2001349881 | 6/2000 |
|----|------------|--------|
| JP | 2000194121 | 7/2000 |

(Continued)

OTHER PUBLICATIONS

Jerry Cullins, et al; "157-nm Photomask Handling and Infrastructure: Requirements and Feasibility", Proceedings of the SPIE, SPIE, Bellingham, VA, U.S. vol. 4409, Apr. 27, 2001, pp. 632-640, XP002287329.

(Continued)

*Primary Examiner*—Michael Cleveland
*Assistant Examiner*—Nicole Blan
(74) *Attorney, Agent, or Firm*—Ladas & Parry LLP

(57) ABSTRACT

The present invention provides a method for cleaning a photo mask without the need for removal of the pellicle mounted on the photo mask, without the large scale equipment for washing with a solution, with a small number of steps for cleaning and inspection, and without the increase of the production cost. The method for cleaning a photo mask with a pellicle mounted, in which the pellicle frame has a gas introducing hole and a gas discharging hole, comprises: a step of introducing a gaseous substituting substance from the gas introducing hole in a pellicle inner space surrounded by the photo mask and the pellicle, substituting foreign substances on the photo mask, and discharging the foreign substances from the gas discharging hole; and a step of irradiating an ultraviolet ray to the photo mask, while an air or a nitrogen gas or a rare gas is introduced from the gas introducing hole, for degrading the substituted substituting substance so as to be gaseous, and discharging the same from the gas discharging hole.

8 Claims, 1 Drawing Sheet

FOREIGN PATENT DOCUMENTS

| | | |
|---|---|---|
| JP | 2004-053817 | 2/2004 |
| JP | 2005334840 | 12/2005 |
| JP | 2006-011048 | 1/2006 |
| JP | 2006-091667 | 4/2006 |
| WO | 02/052345 | 7/2002 |

OTHER PUBLICATIONS

European Search Report Application/Patent No. 07016113.8-1226, Feb. 21, 2008.

* cited by examiner

METHOD FOR CLEANING PHOTO MASK

BACKGROUND OF THE INVENTION

1. Field of the Invention

The present invention relates to a method for cleaning a photo mask to be used for the semiconductor production, in particular, it relates to a method for cleaning a photo mask in a state with a pellicle mounted.

2. Description of the Related Art

According to the photolithography technique used for the production of a semiconductor device or the like, for preventing the transfer of the foreign substances such as the dusts adhered on a photo mask to a wafer, a pellicle is mounted on one side or both sides of the mask using a sticky material or an adhesive. The pellicle comprises a pellicle film made of a fluorine resin film or the like, and a pellicle frame having a predetermined thickness for separating the pellicle film from the mask by a certain distance. The pellicle film is adhered on the upper surface of the pellicle frame so as to form a container-like shape for forming a space with the pellicle and the photo mask (hereafter, it is described as "the pellicle inner space").

Recently, with the trend of the miniaturization and the high integration of the LSI patterns, according to the photolithography technique to be used for the pattern formation, wavelength of the light source of the exposing device has become shorter from the g line (436 nm) and the i line (365 nm) of a high pressure mercury lamp to the KrF excimer laser (248 nm) and the ArF excimer laser (193 nm). Since such an exposing light source of a short wavelength has high output, the light energy is high, and thereby it causes a phenomenon where foreign substances is grown on the photo mask used for the exposure as the time advances. It is pointed out that the growing of the foreign substances is notable when the exposing light has a shorter wavelength. The foreign substances generated on the photo mask are transferred onto a wafer so as to bring out breakage or short circuit of the semiconductor element circuit.

As to the generation of the growing foreign substances on the photo mask at the time of using a short wavelength exposing light source, as one of the major factors, it is said that a sulfuric acid ion as an acidic substance used for mask washing, remaining on the mask surface after production of the photo mask, and a basic substance such as ammonium present in the mask use environment are reacted by the excimer laser irradiation at the time of the pattern transfer so as to generate ammonium sulfide or the like for providing the foreign substances (see, for example, Japanese Patent Application Laid-Open (JP-A) Nos. 2006-11048, and 2004-53817).

Therefore, even though it is in a preferable quality state without a defect at the inspection after the production of the photo mask, there is a problem in that foreign substances are generated on the photo mask by the repeated excimer laser irradiation with an exposing device, and thereby a good pattern transfer image onto the wafer cannot be obtained.

As to the above-mentioned foreign substances problem, according to a conventional method for washing a photo mask with a pellicle, in the case the growing foreign substances are generated on the mask in the pellicle inner space, since it cannot be washed in a state with the pellicle mounted, the pellicle is separated from the photo mask. And then, for removing the sticky material or the adhesive used for adhering the pellicle on the photo mask, the photo mask is washed with a solution such as hydrogen peroxide sulfate (a solution mixture of sulfuric acid and hydrogen peroxide water) referred to as a piranha solution, or an organic solvent, or a hydrogen peroxide ammonia (a solution mixture of an ammonia water and a hydrogen peroxide water) referred to as a SC-1 solution, and after the washing operation, a new pellicle is mounted again. Moreover, according to the above-mentioned washing method, the pellicle cannot be reused, it is known that a method for washing a photo mask using the pellicle frame capable of dividing it in two for facilitating detachment of the fragile pellicle film. In this method, the pellicle film is detached at the time of washing (see for example JP-A No. 2006-91667).

SUMMARY OF THE INVENTION

According to the above-mentioned methods of the conventional technique, it is necessary to inspect whether or not foreign substances are present on the photomask after removing the pellicle for washing, to mount a new pellicle again, and furthermore, to re-inspect the presence of the foreign substances after mounting the pellicle. Therefore, at least two washing steps and two inspection steps are necessary. Specifically, washing steps include washing mainly for the removal of the sticky material or the adhesive and washing for the removal of minute foreign substances, and inspection steps include inspection before mounting the pellicle and inspection after mounting the pellicle. There is a problem in that it takes time for the large number of steps so as to give rise to the increase of the mask production cost and the delay of the time of delivery.

Moreover, according to the method for washing the photo mask disclosed in JP-A No. 2006-91667, a special pellicle frame to be divided in two of an upper frame and a lower frame is needed, and dividing and re-bonding of the two frames before and after the washing is also needed. Since a solution is used for washing, large scale equipment is required for the environmental countermeasure, and there is a problem to increase the cost for the mask production. Moreover, since the lower frame is adhered to the mask substrate, it is difficult to use a strong washing solution, so there is the limitation that usable washing solution is only pure water or the like, and it causes a problem that the washing effect is insufficient and a drying step is required for the washing solution after the washing operation.

Accordingly, the present invention has been achieved in view of the above-mentioned problems. That is, the present invention provides a method for cleaning a photo mask in a state with a pellicle mounted, without the need for removal of the pellicle mounted on the photo mask, without the large scale equipment for washing with a solution, with a small number of steps for cleaning and inspection, with a short-time for cleaning and inspection, and without the increase of the production cost.

In order to solve the above-mentioned problems, a method for cleaning a photo mask of a first aspect of the present invention is a method for cleaning a photo mask with a pellicle mounted, in which the pellicle has a pellicle frame and a pellicle film adhered on the upper surface of the pellicle frame and the pellicle frame has a gas introducing hole and a gas discharging hole, comprising: a step of introducing a gaseous substituting substance from the gas introducing hole in a pellicle inner space surrounded by the photo mask and the pellicle, substituting foreign substances on the photo mask with the substituting substance, and discharging the foreign substances form the gas discharging hole; and a step of irradiating an ultraviolet ray to the photo mask, while an air or a nitrogen gas or a rare gas is introduced from the gas introducing hole, for degrading the substituted substituting substance so as to be gaseous, and discharging the same from the gas discharging hole.

A method for cleaning a photo mask of a second aspect of the present invention is the method for cleaning a photo mask according to the first aspect, wherein the above-mentioned foreign substances are ammonium sulfate.

A method for cleaning a photo mask of a third aspect of the present invention is the method for cleaning a photo mask according to the first or second aspect, wherein the above-mentioned substituting substance is an organic compound having a large polarity and a small molecular weight.

A method for cleaning a photo mask of a fourth aspect of the present invention is the method for cleaning a photo mask according to the third aspect, wherein the above-mentioned organic compound is one kind or a mixture of two or more kinds selected from the group consisting of alcohols, ethers and organic acid esters.

A method for cleaning a photo mask of a fifth aspect of the present invention is the method for cleaning a photo mask according to the third aspect, wherein the above-mentioned organic compound is ethylene glycol.

A method for cleaning a photo mask of a sixth aspect of the present invention is the method for cleaning a photo mask according to any of the first to fifth aspects, wherein degradation of the above-mentioned substituted substituting substance is carried out by a photo degradation or an ozone oxidation degradation in the air atmosphere by using the ultraviolet ray.

A method for cleaning a photo mask of a seventh aspect of the present invention is the method for cleaning a photo mask according to any of the first to sixth aspects, wherein the above-mentioned the air, the nitrogen gas or the rare gas is an air, a nitrogen gas or a rare gas with the water vapor added.

A method for cleaning a photo mask of a eighth aspect of the present invention is the method for cleaning a photo mask according to any of the first to seventh aspects, wherein the above-mentioned ultraviolet ray has a wavelength longer than the exposure wavelength on using the photo mask.

Since the method for cleaning a photo mask of the present invention is not a wet washing method using a solvent but a dry cleaning method of removing the growing foreign substances using a gas so that a photo mask to be used for the semiconductor production can be cleaned in a state with a pellicle mounted and thus the foreign substances can be removed efficiently without the need for using large scale equipment, the production efficiency can be improved. Moreover, since the pellicle needs not be removed and remounted, the pellicle material cost and the pellicle mounting cost can be reduced, the number of inspection and cleaning steps can be less, and the mask production cost can be cut back, and thus the effect of shortening the time of delivery of the mask can be achieved.

DESCRIPTION OF THE PREFERRED EMBODIMENT

Figure 1A:
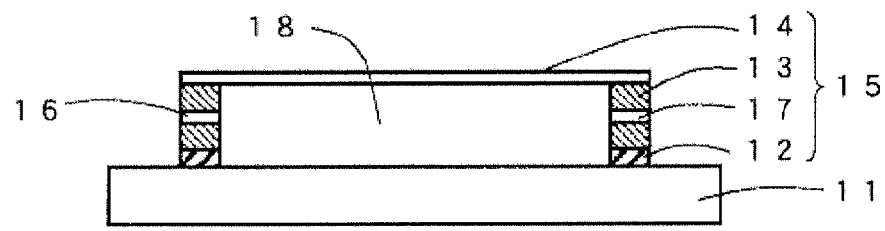
FIG. 1 is a process cross-sectional schematic diagram showing an embodiment of a method for cleaning a photo mask with a pellicle mounted of the present invention.

Hereinafter, with reference to the drawing, an embodiment of a method for cleaning a photo mask of the present invention will be explained.

FIG. 1 is a process cross-sectional schematic diagram showing a method for cleaning a photo mask with a pellicle mounted of the present invention.

FIG. 1A is a cross-sectional view showing a photo mask with a pellicle mounted before cleaning, and showing a state in need for cleaning the mask with the growing foreign substances produced on the mask during the photolithography by the excimer laser exposure.

The photo mask with a pellicle mounted shown in FIG. 1A comprises a photo mask 11 having a predetermined mask pattern on a transparent substrate, a pellicle 15 having a pellicle frame 13 adhered on the photo mask 11 with a sticky material 12, and a pellicle film 14 adhered on the pellicle frame 13 for protecting the photo mask 11. The pellicle frame 13 is provided with a gas introducing hole 16 and a gas discharging hole 17. The pellicle 15 and the photo mask 11 provide a pellicle inner space 18.

As the photo mask 11 capable of applying the cleaning method of the present invention, any mask with the pellicle 15 mounted and with the growing foreign substances generated can be subject for cleaning. As the photo mask 11, the conventionally known masks can be used. For example, a binary mask with a mask pattern formed with chromium on a transparent substrate of synthetic quartz, and a phase shift mask with a mask pattern formed with a molybdenum silicide compound can be presented.

The pellicle frame 13 is formed in general with an aluminum alloy or plastic. As the pellicle film 14, a thin film of an organic polymer such as a fluorine resin, or a thin film of a synthetic quartz glass can be used.

The gas introducing hole 16 and the gas discharging hole 17 are provided in the pellicle frame 13 at one or more positions respectively, in other words, a plurality of them may be formed. Since they are for introducing or discharging a gas, the hole shape is preferably round, with a hole diameter preferably in a range of about 0.1 mm to 2 mm. According to the recent pellicles, for preventing breakage of the pellicle film by the change in barometric pressure during air transportation, through holes are provided in the pellicle frame at one or more positions for the atmospheric circulation between the pellicle inner space and the outside. As the gas introducing hole and the gas discharging hole of the present invention, these conventionally provided through holes may be utilized. Furthermore, according to the present invention, a pellicle with a filter mounted on the gas introducing hole 16 and the gas discharging hole 17 may be used for preventing the invasion of the dusts on inflowing the atmosphere.

Growing foreign substances (not shown) are adhered on the synthetic quarts substrate as the transparent substrate for the photo mask 11 in the pellicle inner space 18. In general, the growing foreign substances on the photo mask contain an acid ion or an alkaline ion such as a sulfuric acid ion and an ammonium ion in many cases. Examples of the foreign substance include ammonium sulfate, one having a sulfuric acid ion and an organic substance, and one having an ammonium ion and an organic substance. The presence of the foreign substances can be detected by the visual inspection with the floodlight, or the microscope inspection. For the analysis and measurement of the foreign substances, known analysis methods such as a gas chromatography (GC) or a gas chromatography mass analysis device (GC-MS) may be used for organic foreign substances, and an ion chromatography (IC) may be used for ionic foreign substances.

Although the cleaning method of the present invention may also be employed for the above-mentioned foreign substances other than ammonium sulfate, since the cleaning effect is particularly remarkable in the case of use for the foreign substances containing a sulfuric acid ion and/or an ammonium ion, it is more preferable.

The growing foreign substances as mentioned above are produced by the photo chemical reaction generated on the surface of the photo mask or in the vicinity of the surface by the high energy light irradiation on using the photo mask. If the foreign substrate is generated, there is a problem that the transmittance at the time of the mask pattern exposure is fluctuated so as to affect the transfer. The foreign substances to affect the transfer are often generated on the photo mask transmitting portion, that is, on $SiO_2$ as the synthetic quartz substrate.

Figure 1B:
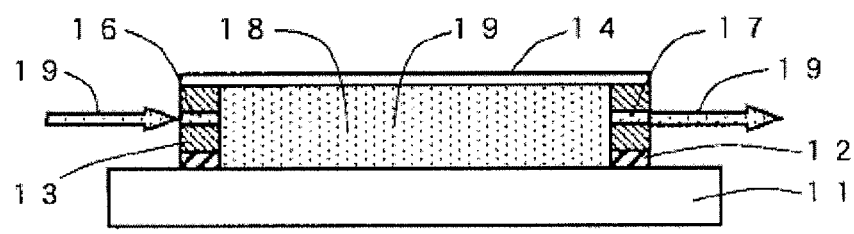

Next, as shown in FIG. 1B, a substituting gas 19 is introduced for a certain time from the gas introducing hole 16 of the pellicle frame 13 into the pellicle inner space 18 and it is discharged form the gas discharging hole 17. At the time, the foreign substances on the photo mask are substituted by the substituting gas 19, and the foreign substances desorbed from the photo mask are discharged forcibly from the gas discharging hole 17 by the gas flow together with the substituting gas 19.

The above-mentioned foreign substances and substitution by the substituting gas will be explained in further detail. In general, a gas layer is present in the periphery of the synthetic quartz substrate $SiO_2$ of the photo mask 11 in the pellicle inner space 18. The foreign substances growth on the surface of the synthetic quartz substrate is influenced remarkably by the desorption speed to the gas layer and the adsorption speed to the surface.

A substance with a low desorption speed to the gas layer is easily condensed on the $SiO_2$ surface so as to finally be a pollution source. Here, since the surface area of $SiO_2$ in the pellicle inner space 18 is constant, the pollutant substance to be the foreign substances is not adsorbed limitlessly so that the pollution is at the maximum value when the surface of the photomask 11 of the pellicle inner space 18 is completely covered. At the time, depending on the degree of the pollution ability, the pollutant may be substituted. That is, the pollutant substitution phenomenon called the "musical chairs phenomenon" is occurred. For example, it is known that ester propionate adhered on a cleaned surface is substituted by DOP (dioctyl phthalate) as the time advances.

Here, with respect to the "musical chairs phenomenon", as it is disclosed in JP-A No. 2001-349881, Habuka, et al., they propose the following formula (1) as to the surface concentration of a plurality of organic substances adsorbed on the solid surface, which is changed as the time advances, when a solid having a cleaned surface without adhesion of an organic substance is exposed in the environmental air. They propose that the pollutant substitution phenomenon can be analyzed based on the formula (1):

$$dSi/dt = (Smax - S) \times kad, i \times Ci - kde, i \times Si \quad (1)$$

wherein "Ci" is the concentration of an organic substance "i" in the environmental air, "Si" is the concentration of an organic substance adsorbed on the solid surface, "S" is the total of the concentration "Si" of the organic substance "i" adsorbed on the solid surface, "Smax" is the maximum value of the total "S" of the concentration "Si" of the organic substance "i" adsorbed on the solid surface, "kad,i" is an adsorption speed constant to the solid surface of the organic substance "i", and "kde,i" is a desorption speed constant from the solid surface of the organic substance "i".

The present inventor has directed the attention to the fact that the formula (1) of Habuka, et al. related to the above-mentioned "musical chairs phenomenon" can also be applied to the case of substituting the foreign substances on the photo mask with a substituting substance so as to complete the present invention.

In the present invention, as the substituting gas 19 used in a gaseous form, an organic substance having a high substitution reactivity with the foreign substances and being easily processed to gas can be used. Therefore, an organic compound having a large polarity and a small molecular weight is preferable. That is, the organic compound as the substituting substance 19 is preferably one kind or a mixture of two or more kinds selected from the group consisting of alcohols, ethers and organic acid esters.

Examples of the alcohols include methyl alcohol, ethyl alcohol, and isopropyl alcohol. Examples of the ethers include methyl ether, ethyl ether, and methyl ethyl ether. Examples of the organic acid esters include methyl formate and ethyl acetate. Among these substituting substances, an ethylene glycol is more preferable as the organic compound because it has a desorption speed lower than that of a foreign substances containing a sulfuric acid ion and/or an ammonium ion so as to substitute the foreign substances on the $SiO_2$ surface, and it is easily degraded into $CO_2$ and $H_2O$ with a short wavelength ultraviolet ray in the air atmosphere.

Examples of the method for introducing the above-mentioned substituting substance in a gaseous state into the pellicle inner space 18 include: a method of making the substituting substance into a gas state by heating, and introducing it with a clean gas as a carrier gas such as an air or a nitrogen gas having passed through an air filter; and a method of bubbling a liquid substituting substance with a carrier gas such as an air or a nitrogen gas, and introducing the substituting substance into the pellicle inner space 18 together with the carrier gas. The gaseous substituting substance and the carrier gas are preferably used after passing a filter. The concentration of the substituting substance in a gaseous form contained in the carrier gas is not particularly limited, but it is preferable in the range of 5% to the saturated concentration, because the substitution speed is made higher when the concentration and flow rate is high. With a concentration of less than 5%, substitution of the foreign substances takes too much time, and on the other hand, with a concentration of more than the saturated concentration, the substituting substance is precipitated so as to be wasted.

Figure 1C:
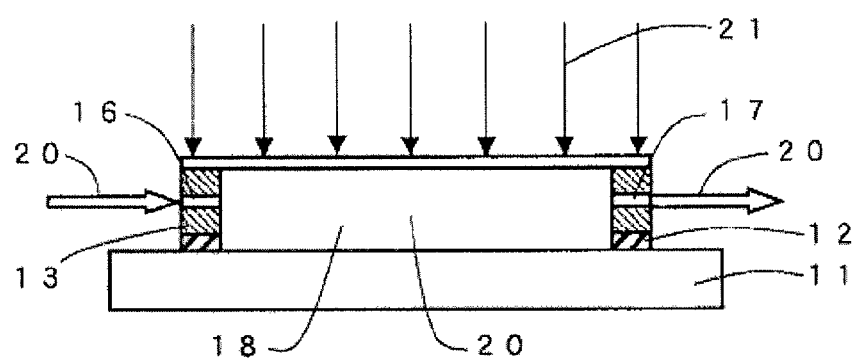
Figure 1D:
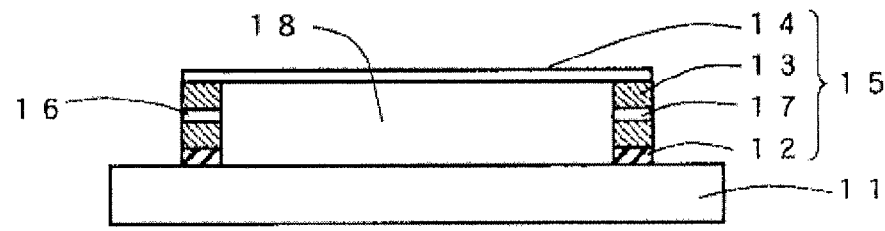

Next, as shown in FIG. 1C, by irradiating an ultraviolet ray 21 to the photo mask 11 with the pellicle 15 mounted, while an air or a nitrogen gas or a rare gas (gas 20) is introduced from the gas introducing hole 16, for the photo degradation of the substituting substance adhered on the photo mask surface, the substituting substance which is substituted from the foreign substances is changed to be gaseous. In the case where the air is used as the gas, by the oxidation degradation of the substituting substance by using active oxygen of the ozone generated by the ultraviolet ray irradiation, the substituting substance which is substituted from the foreign substances is changed to be gaseous. These gaseous substituting substance is discharged from the gas discharging hole 17 to the outside of the pellicle 15 together with the air or the nitrogen gas or the rare gas (gas 20). The ozone oxidation degradation of the substituting substance in the air atmosphere is advantageous in that building of the gas cleaning system is easy and the cleaning cost can be reduced.

In FIG. 1C, the ultraviolet ray 21 was irradiated to the entire surface of the pellicle 15 from the upper side thereof, the ultraviolet ray may be irradiated from the lower side (transparent substrate side) of the pellicle 15 at the same time of above upper side irradiation. Also a method of irradiating an ultraviolet ray locally to the portion where the foreign substances are present may be used. In general, from the viewpoint of the workability convenience, the entire surface irradiation from above the pellicle 15 is preferable.

In the present invention, it is preferable that an air or a nitrogen gas or a rare gas (gas 20) has been passed through an air filter before introducing it to the pellicle space 18 for avoiding the invasion of the dusts. As the rare gas, any gas of He, Ne and Ar gas can be used. From the viewpoint of the easy purchase and inexpensiveness, an air or a nitrogen gas is more preferable.

In the above-mentioned, since a phenomenon of the electrostatic breakage of the mask pattern may be occurred if dry gas is introduced, it is preferable to use a gas adding the water vapor to an air or a nitrogen gas or a rare gas mentioned above for preventing electrostatic charge. The relative humidity of the gas with the water vapor added is preferably in a range of about 40% to 60%, which is the humidity of a general clean room.

As the ultraviolet ray 21 to be used in the present invention, those having a wavelength capable of executing photo degradation or the oxidation degradation in the air atmosphere to the substituting substance without affecting the pellicle film 14 can be used, and an ultraviolet ray having a wavelength of the exposing wavelength on using the photo mask or longer can be used. In terms of less influence to the pellicle film 14, it is preferable that an ultraviolet ray has a wavelength longer than the exposure wavelength in such a range that the photo degradation or the oxidation degradation in the air atmosphere of the substituting substance can be occurred. For example, when an ArF excimer laser of a 193 nm is used for the exposing light, preferable examples of the ultraviolet ray 21 include a KrF excimer laser (wavelength 248 nm), and an ultraviolet ray of a 253.7 nm wavelength or an i line (wavelength 365 nm) of a mercury lamp.

By cleaning the pellicle inner space 18 as mentioned above, as shown in FIG. 1D, a cleaned photo mask without the presence of the foreign substances such as ammonium sulfate on the photo mask 11 in the pellicle inner space 18 can be obtained. According to the mask, the inspection is carried out only one-time after cleaning, the step is short, and the mask production cost can be reduced.

The cleaning method of the present invention can be applied for the growing foreign substances present not only on the photo mask 11, but also on a pellicle film 14 or a pellicle frame 13 constituting a pellicle space 18.

EXAMPLES

Example 1

A 60 nm thickness chromium binary mask having a 65 nm half pitch mask pattern (tetraploid on the mask) was formed on an optically polished synthetic quartz substrate with 0.25 inch thickness, and 6 inch square. A pellicle having a pellicle frame of an aluminum alloy and a pellicle film of a fluorine resin was adhered to the above mask to obtain a photomask with a pellicle mounted. The pellicle frame was provided with a gas introducing hole and a gas discharging hole of a 1 mm hole diameter at one portion respectively.

It was confirmed that the above-mentioned photo mask with a pellicle mounted has no defect such as foreign substances in a mask defect inspection.

Next, with the photo mask installed on an ArF excimer laser exposing device, a silicon wafer with a photosensitive resist applied was exposed. Since a pattern defect was generated on the wafer when the exposing time using the photo mask has become long in total, a mask inspection was executed so as to find that growing foreign substances of ammonium sulfate was generated on the mask in the pellicle inner space.

In order to clean the above-mentioned photo mask with a pellicle mounted and with the growing foreign substances generated, ethylene glycol was heated to be a gas, and air having passed through an air filter was prepared as a carrier gas, and the water vapor was added to obtain the gaseous substituting substance (ethylene glycol concentration 10%/air, and relative humidity 45%). Then the gaseous ethylene glycol was introduced from the gas introducing hole of the pellicle frame through a filter and was discharged from the gas discharging hole. The gaseous ethylene glycol was supplied for a certain time to substitute the foreign substances on the mask with the ethylene glycol.

Subsequently, while ultraviolet ray including 253.7 nm wavelength (which generates the active oxygen) was irradiated to the entire surface of the photo mask from the upper side thereof by using a mercury lamp, a clean air having passed through an air filter was supplied from the gas introducing hole by flow rate of 0.1 liter/minute to degrade the ethylene glycol on the mask by oxidization and to remove it from the gas discharging hole. In the above-mentioned gas cleaning operation, no damage was generated to the pellicle film.

Next, according to the mask inspection of the photo mask with a pellicle mounted, the mask surface was clean and presence of foreign substances was not confirmed. Using the mask, the ArF excimer laser exposure was carried out again so as to obtain a good pattern without a defect on the wafer.

Example 2

In the same manner as in the example 1, a 6 inch square photomask for the ArF excimer laser exposure with growing foreign substances of ammonium sulfate generated was prepared on a mask in the pellicle inner space provided with a pellicle film of a fluorine resin.

In order to clean the above-mentioned photo mask with a pellicle mounted, ethylene glycol was heated to be a gas, and a nitrogen gas having passed through an air filter was prepared as a carrier gas, and the water vapor was added to obtain the gaseous substituting substance (ethylene glycol concentration 20%/nitrogen, and relative humidity 45%). Then the gaseous ethylene glycol was introduced from the gas introducing hole of the pellicle frame through a filter and was discharged from the gas discharging hole. The gaseous ethylene glycol was supplied for a certain time to substitute the foreign substances on the mask with the ethylene glycol.

Subsequently, while an ArF excimer laser beam having a 193 nm wavelength was irradiated to the entire surface of the photo mask from the upper side thereof, a clean nitrogen gas having passed through an air filter was supplied from the gas introducing hole by flow rate of 0.1 liter/minute to degrade the ethylene glycol on the mask by photo degradation and to remove it from the gas discharging hole. In the above-mentioned gas cleaning operation, no damage was generated to the pellicle film.

Next, according to the mask inspection of the photo mask with a pellicle mounted, the mask surface was clean and presence of foreign substances was not confirmed. Using the mask, the ArF excimer laser exposure was carried out again so as to obtain a good pattern without a defect on the wafer.

What is claimed is:

1. A method for cleaning a photomask with a pellicle mounted, in which the pellicle has a pellicle frame and a pellicle film adhered on the upper surface of the pellicle frame and the pellicle frame has a gas introducing hole and a gas discharging hole, comprising:

a step of introducing a gaseous substituting substance from the gas introducing hole in a pellicle inner space surrounded by the photo mask and the pellicle, substituting foreign substances on the photo mask with the substituting substance, and discharging the foreign substances form the gas discharging hole; and a step of irradiating an ultraviolet ray to the photo mask, while an air or a nitrogen gas or a rare gas is introduced from the gas introducing hole, for degrading the substituted substituting substance so as to be gaseous, and discharging the same from the gas discharging hole.

2. The method for cleaning a photo mask according to claim 1, wherein the foreign substances include a sulfuric acid ion and/or an ammonium ion.

3. The method for cleaning a photo mask according to claim 1, wherein the substituting substance is an organic compound having a large polarity and a small molecular weight.

4. The method for cleaning a photo mask according to claim 3, wherein the organic compound is one kind or a mixture of two or more kinds selected from the group consisting of alcohols, ethers and organic acid esters.

5. The method for cleaning a photo mask according to claim 3, wherein the organic compound is ethylene glycol.

6. The method for cleaning a photo mask according to claim 1, wherein the degradation of the substituted substituting substance is carried out by a photo degradation or an ozone oxidation degradation in the air atmosphere by using the ultraviolet ray.

7. The method for cleaning a photo mask according to claim 1, wherein the air, the nitrogen gas or the rare gas is an air, a nitrogen gas or a rare gas with the water vapor added.

8. The method for cleaning a photo mask according to claim 1, wherein the ultraviolet ray has a wavelength longer than the exposure wavelength on using the photo mask.

* * * * *